(12) United States Patent
Walker (10) Patent No.: US 7,065,300 B1
(45) Date of Patent: Jun. 20, 2006

(54) OPTICAL TRANSMITTER INCLUDING A LINEAR SEMICONDUCTOR OPTICAL AMPLIFIER

(75) Inventor: Jeffrey D Walker, El Cerrito, CA (US)

(73) Assignee: Finsiar Corporation, Sunnyvale, CA (US)

( * ) Notice: Subject to any disclaimer, the term of this patent is extended or adjusted under 35 U.S.C. 154(b) by 668 days.

(21) Appl. No.: 10/017,358

(22) Filed: Dec. 13, 2001

Related U.S. Application Data (63) Continuation-in-part of application No. 10/014,679, filed on Dec. 11, 2001.

(60) Provisional application No. 60/274,407, filed on Mar. 9, 2001, provisional application No. 60/255,753, filed on Dec. 14, 2000.

(51) Int. Cl.
*H04B 10/00* (2006.01)

(52) U.S. Cl. .................. 398/135; 359/263; 359/344

(58) Field of Classification Search ........... 359/263, 359/344; 372/46; 438/706; 398/135
See application file for complete search history.

(56) References Cited

U.S. PATENT DOCUMENTS

| | | | |
|---|---|---|---|
| 3,467,906 A | 9/1969 | Cornely et al. ............ 330/4.3 |
| 3,828,231 A | 8/1974 | Yamamoto .................. 357/30 |
| 4,794,346 A | 12/1988 | Miller |
| 5,299,054 A | 3/1994 | Geiger |
| 5,305,412 A | 4/1994 | Paoli |
| 5,436,759 A | 7/1995 | Dijaili et al. ............. 359/333 |
| 5,604,628 A | 2/1997 | Parker et al. |
| 5,654,822 A | 8/1997 | Ducellier et al. |
| 5,657,148 A * | 8/1997 | Feuer et al. .............. 359/263 |
| 5,673,141 A | 9/1997 | Gambini |
| 5,748,653 A | 5/1998 | Parker et al. |
| 5,754,571 A | 5/1998 | Endoh et al. |
| 5,771,320 A | 6/1998 | Stone |
| 5,778,132 A | 7/1998 | Csipkes et al. |
| 5,805,322 A | 9/1998 | Tomofuji |
| 5,811,838 A * | 9/1998 | Inomoto ...................... 257/80 |
| 5,949,807 A | 9/1999 | Fujimoto et al. ............. 372/45 |
| 5,960,024 A | 9/1999 | Li et al. ...................... 372/96 |
| 5,999,293 A | 12/1999 | Manning |
| 6,044,100 A | 3/2000 | Hobson et al. .......... 372/46.01 |
| 6,061,156 A | 5/2000 | Takeshita et al. |
| 6,115,517 A | 9/2000 | Shiragaki et al. ............ 385/24 |
| 6,128,115 A | 10/2000 | Shiragaki et al. |
| 6,215,583 B1 | 4/2001 | Lagerstrom et al. |

(Continued)

FOREIGN PATENT DOCUMENTS

JP 56006492 1/1981

(Continued)

OTHER PUBLICATIONS

S. Diez et al., *All-Optical Switch for TDM and WDM/TDM Systems Demonstrated in a 640 Gbit/s Demultiplexing Experiment*, Electronics Letters, vol. 34, No. 8, pp. 803-805, Apr. 16, 1988.

(Continued)

*Primary Examiner*—David C. Payne
(74) *Attorney, Agent, or Firm*—Workman Nydegger (57) ABSTRACT

An improved optical transmitter comprises a vertically lasing semiconductor optical amplifier (VLSOA) coupled to an external modulator and/or a laser source. The VLSOA, external modulator and laser source are discrete devices or alternatively integrated onto a common substrate. The integrated optical transmitter may be fabricated using a number of different methods, including based on selective area epitaxy, impurity induced disordering, etch and fill and silicon optical bench.

45 Claims, 8 Drawing Sheets

U.S. PATENT DOCUMENTS

| | | | |
|---|---|---|---|
| 6,317,531 B1 | 11/2001 | Chen et al. | |
| 6,333,799 B1 | 12/2001 | Bala et al. | |
| 6,335,992 B1 | 1/2002 | Bala et al. | |
| 6,347,104 B1 | 2/2002 | Dijaili et al. | |
| 6,347,106 B1* | 2/2002 | Dijaili et al. | 372/46 |
| 6,462,865 B1 | 10/2002 | Chu et al. | |
| 6,516,017 B1* | 2/2003 | Matsumoto | 372/50 |
| 6,522,462 B1 | 2/2003 | Chu et al. | |
| 6,577,654 B1 | 6/2003 | Dijaili et al. | |
| 6,707,600 B1 | 3/2004 | Dijaili et al. | |
| 6,714,344 B1 | 3/2004 | Islam et al. | |
| 2002/0001112 A1 | 1/2002 | Song | |

FOREIGN PATENT DOCUMENTS

| | | |
|---|---|---|
| JP | 01129483 | 11/1987 |
| JP | 10190147 | 7/1998 |
| JP | 02000012978 A | 1/2000 |

OTHER PUBLICATIONS

S. Diez et al., *Gain-Transparent SOA-Switch for High-Bitrate OTDM Add/Drop Multiplexing,* IEEE Photonic Technology Letters, vol. 11, No. 1, pp. 60-62, Jan. 1999.

S. Diez et al., *Novel Gain-Transparent SOA-Switch for High Bitrate ODTM Add/Drop Multiplexing,* ECOC 1998, vol. 1, pp. 461-462, Sep. 1998.

B. Femier et al., *Fast (3000 ps) Polarization Insensitive Semiconductor Optical Amplifier Switch with Low Driving Current (70 mA)*, Semiconductor Laser Conference, Conference Digest, 14th IEEE International, pp. 130-131, Sep. 21-15, 1992.

J.E. Fouquet et al., *Compact, Scalable Fiber Optic Cross-Connect Switches,* IEEE, 1999 Digest of the LEOS Summer Topical Meetings, pp. 59-60, 1999.

M.M. Ibrahim, *Photonic Switch Using Surface-Emitting Laser Diode and AOD,* 16th National Radio Science Conference, NRSC 1999, pp. 1-8, Ain Shams University, Cairo, Egypt, Feb. 23-25, 1999.

J. Mork et al., *Semiconductor Devices for All-Optical Signal Processing: Just How Fast Can They Go?*, IEEE Lasers and Electro-Optics Society 1999 12th Annual Meeting, LEOS 1999, vol 2, pp. 900-901, Nov. 8-11, 1999.

K. Panajotov et al., *Polarisation Switching in Proton-Implanted VCSELs,* 1999 Digest of the LEOS Summer Topical Meetings, pp. 55-56, Jul. 26-30, 1999.

B.C. Qui et al., *Monolithically Integrated Fabrication of 2×2 and 4×4 Crosspoint Switches Using Quantum Well Intermixing,* 2000 International Conference on Indium Phosphide and Related Materials, Conference Proceedings, pp. 415-418, May 14-18, 2000.

J. Scheuer et al., *Nonlinear On-Switching of High Spatial Frequency Patterns in Ring Vertical Cavity Surface Emitting Lasers,* 1999 IEEE LEOS Annual Meeting Conference Proceedings, 12th Annual Meeting, IEEE Lasers and Electro-Optics Society 1999 Annual Meeting, vol. 1, pp. 123-124, Nov. 8-9, 1999.

H. Soto et al., *All-Optical Switch Demonstration Using a Birefringence Effect in a Semiconductor Optical Amplifier,* IEEE CLEO, Pacific rim 1999, pp. 886-889, 1999.

N. Yoshimoto et al., *Spot-Size Converted Polarization-Insensitive SOA Gate with a Vertical Tapered Submicrometer Stripe Structure,* IEEE Photonics Technology Letters, vol. 10, No. 4, pp. 510-512, Apr. 4, 1998.

Wolfson et al., *Detailed Theoretical Investigation of the Input Power Dynamic Range for Gain-Clamped Semicon ductor Optical Amplifier Gates at 10 Gb/s,* IEEE Photonics Technology Letters, 1998, vol. 10, No. 9, pp. 1241-1243.

F. Robert et al., *All-Optical Set-Rest Operation of a Bistable Semiconductor Laser Intracavity-Coupled to a Vertical-Cavity Surface-Emitting Laser,* IEEE Photonic Technology, Letters, vol. 12, No. 5, May 2000, pp. 465-467.

D.B. Shire et al., *Gain Controlled Vertical Cavity Surface Emitting Lasers Coupled with Intracavity In-plane Lasers,* Appl. Phys. Lett. vol. 66, No. 14, Apr. 3, 1995, pp. 1717-1719.

Alcatel, "Alcatel Optronics introduces a Gain-Clamped Semiconductor Optical Amplifier," *Press Release for Immediate Publication,* OFC '98, San Jose (Feb. 1998), 1 unnumbered page.

Bauer, B. et al., "Gain Stabilization of a Semiconductor Optical Amplifier by Distributed Feedback," *IEEE Photonics Technology Letters,* vol. 6, No. 2 (Feb. 1994), pp. 182-185.

Dorgeuille, F., et al., "1.28 Tbit/s Throughput 8×8 Optical Switch Based on Arrays of Gain-Clamped Semiconductor Optical Amplifier Gates," Optical Fiber Communication Conference, vol. 4, pp. 221-223, Mar. 2000.

Dorgeuille, F., et al., H., "Fast Optical Amplifier Gate Array for WDM Routing and Switching Applications," OFC '98 Technical Digest, pp. 42-44, 1998.

Doussiere, P. et al., "Clamped Gain Travelling Wave Semiconductor Optical Amplifier for Wavelength Division Multiplexing Applications," Maui, Hawaii, Sep. 19-23, 1994, New York, IEEE, US, vol. Conf. 14 (Sep. 14, 1994), pp. 185-186.

Evankow, Jr., J.D., "Photonic Switching Modules Designed with Laser Diode Amplifiers," IEEE, Journal on Selected Areas in Communications, vol. 6, No. 7, pp. 1087-1095, Aug. 1988.

Gee, S. et al., "High-Power Mode-Locked External Cavity Semiconductor Laser Using Inverse Bow-Tie Semiconductor Optical Amplifiers," *IEEE Journal of Selected Topics in Quantum Electronics,* vol. 4, No. 2, Mar./Apr. 1998, pp. 209-215.

Jeong, G., et al., "Gain Optimization in Switches Based on Semiconductor Optical Amplifiers," Journal of Lightwave Technology, Vo. 13, No. 4, pp. 598-605, Apr. 1995.

Joyner, C.H. et al., "Extremely Large Band Gap Shifts for MQW Structures by Selective Epitaxy on SiO2 Masked Substrates," *IEEE Photonoics Technology Letters,* vol. 4, No. 9 (Sep. 1992), pp. 1006-1009.

Kitamura, S., et al., "Sport-Size Converter Integrated Semiconductor Optical Amplifiers for Optical Gate Applications," IEEE Journal of Quantum Electronics, vol. 35, No. 7, pp. 1067-1074, Jul. 1999.

Koyama, F., et al., "Multiple-Quantum-Well GainAs/GaInAsP Tapered Broad-Area Amplifiers with Monolithically Integrated Waveguide Lens for High-Power Applications," IEEE Photonics Technology Letters (Aug. 1993), vol. 5, No. 8, pp. 916-919.

Leuthold, J., et al., "All-Optical Space Switches with Gain and Principally Ideal Extinction Ratios," IEEE Journal of Quantum Electronics, vol. 34, No. 4, pp. 622-633, Apr. 1998.

McAdams, L.R. et al., "Linearizing High Performance Semiconductor Optical Amplifiers: Techniques and Performance," LEOS Presentation (1996), pp. 363-364.

Mutalik, V.G. et al., "Analog performance of 1310-nm gain-clamped semiconductor optical amplifiers," *OFC '97 Technical Digest,* Thursday Morning, 11:15 AM, pp. 266-267.

Simon, J.C. et al., "Travelling wave semiconductor optical amplifier with reduced nonlinear distortions," *Electronics Letters*, vol. 30, No. 1 (Jan. 6, 1994), pp. 49-50.

Soulage, G. et al., "Clamped Gain Travelling Wave Semiconductor Optical Amplifier as a Large Dynamic Range Optical Gate," Alcatel Alsthom Recherche, route de Nozay, 91460 Marcoussis, France, undated, 4 unnumbered pages.

Tai, C., et al., "Dynamic Range and Switching Speed Limitations of an NxN Optical Packet Switch Based on Low-Gain Semiconductor Optical Amplifiers," IEEE Journal of Lightwave Technology, vol. 14, No. 4, pp. 525-533, Apr. 4, 1996.

Tiemeijer, L.F. et al., "1310-nm DBR-Type MQW Gain-Clamped Semiconductor Optical Amplifiers with AM-CATV-Grade Linearity," *IEEE Photonics Technology Letters*, vol. 8, No. 11(Nov. 1996), pp. 1453-1455.

Tiemeijer, L.F. et al., "High-Gain 1310 nm Semiconductor Optical Amplifier Modules with a Built-in Amplified Signal Monitor for Optical Gain Control," *IEEE Photonics Technology Letters*, vol. 9, No. 3 (Mar. 1997), pp. 309-311.

Tiemeijer, L.F. et al., "Reduced Intermodulation Distortion in 1300 nm Gain-Clamped MQW Laser Amplifiers," *IEEE Photonics Technology Letters*, vol. 7, No. 3 (Mar. 1995), pp. 284-286.

Toptchiyski, G., et al., "Time-Domain Modeling of Semiconductor Optical Amplifiers for OTDM Applications," IEEE Journal of Lightwave Technology, vol. 17, No. 12, pp. 2577-2583, Dec. 1999.

van Roijen, R., et al., "Over 15 dB Gain from a Monolithically Integrated Optical Switch with an Amplifier," IEEE Photonics Technology Letters, vol. 5, No. 5, pp. 529-531, May 1993.

Walker, J.D. et al., "A Gain-Clamped, Crosstalk Free, Vertical Cavity Lasing Semiconductor Optical Amplifier for WDM Applications," summaries of the papers presented at the topical meeting, Integrated Photonics Search; 1996 Technical Digest Series; Proceedings of Integrated Photonics; Boston, MA, USA, Apr. 29-May 5, 1996, vol. 6, 1996, pp. 474-477.

Agility Unveils Long-Haul Laser, Light Reading—The Global Site for Optical Networking, retrieved from Internet www.lightreading.com/document.asp (Mar. 30, 2001).

* cited by examiner

OPTICAL TRANSMITTER INCLUDING A LINEAR SEMICONDUCTOR OPTICAL AMPLIFIER

CROSS-REFERENCE TO RELATED APPLICATIONS

This application claims priority under 35 U.S.C. § 119(e) to U.S. Provisional Patent Application Ser. No. 60/274,407, "Optical Transmitter Including a Linear Semiconductor Optical Amplifier," by Jeffrey D. Walker, filed Mar. 9, 2001; and U.S. Provisional Patent Application Ser. No. 60/255,753, "Optical Devices including a Semiconductor Optical Amplifier," by Jeffrey D. Walker et al., filed Dec. 14, 2000.

This application is a continuation-in-part of pending U.S. patent application Ser. No. 10/014,679, "Integrated Optical Device Including a Vertical Lasing Semiconductor Optical Amplifier," by Jeffrey D. Walker et al., filed Dec. 11, 2001.

The subject matter of all of the foregoing is incorporated herein by reference in their entirety.

BACKGROUND OF THE INVENTION

1. Field of the Invention

This invention relates generally to optical transmitters. More particularly, it relates to vertically lasing semiconductor optical amplifiers (VLSOAs) used in combination with a laser source and/or a modulator to create an improved optical transmitter.

2. Description of the Related Art

Today, optical systems are used to transmit information at high speeds over large distances. At a high level, a typical optical system consists of an optical transmitter, an optical receiver and an optical fiber connecting the two. The optical transmitter converts an electrical signal containing data into an optical signal and transmits the signal over the optical fiber. The optical receiver then receives the signal from the optical fiber and converts the signal back to an electrical signal, recovering the original data.

Semiconductor lasers are the most widely utilized light source used in transmitters for optical communications systems. The lasers produce a beam of light which is modulated with the data to be transmitted across the optical system. On-off keying is a common modulation scheme used to impress the data onto the optical beam. On-off keying, as well as other types of modulation, can be applied to the optical beam in two basic ways. The first way is direct modulation of the laser. In this case, the optical beam generated by the source is modulated by varying the current driving the laser source. The second way is external modulation, in which the laser source produces an unmodulated optical beam, which is then modulated by a device external to the laser source (i.e., the external modulator).

One problem with direct modulation, particularly in the case of on-off keying, is that direct modulation can result in frequency chirp. For example, in the case of on-off keying, turning the laser source on and off results in a light pulse that is chirped meaning that the frequency of the light drifts over the length of the pulse. This occurs because the injected carrier density in the laser does not remain constant and thus the frequency of the light pulse output by the laser varies over time. The chirped light pulse has a broader frequency spectrum and therefore is more susceptible to pulse broadening due to dispersion as the light pulse travels across the fiber.

Pulse broadening that results from chirping is especially problematic for optical systems that operate at high speeds and/or over long distances. For this reason, direct modulation currently is not favored for optical systems operating at bit rates greater than 5 Gbps regardless of length, optical systems greater than 160 kilometers (km) in length operating at bit rates of 2 Gbps or higher, and optical systems greater than 320 km in length operating at bit rates of 1 Gbps or higher.

One way to essentially avoid the chirping problem is by using external modulators to impose the data onto the optical beam. By placing an external modulator after the laser source to provide the modulation, the laser source is driven by a constant injection current and therefore produces light at a constant frequency (i.e., without chirp). When the modulator imposes the data onto the light, the output light pulse has very low chirp since the light input into the external modulator has a constant frequency and external modulators generally introduce very little chirp. For this reason, external modulators are used for dispersion sensitive systems (i.e., at higher data rates and longer distances). Examples of external modulators that are often used in optical systems include lithium niobate ($LiNbO_3$) modulators and electro-absorption modulators (EAM).

A common optical transmitter used today is an electro-absorption modulated laser (EML). An EML is an integrated source. Typically, an EML consists of a distributed feedback (DFB) or distributed Bragg reflection (DBR) type laser integrated with an external electro-absorption modulator (EAM). These devices also generally include a conventional semiconductor optical amplifier (SOA) integrated between the EAM and the laser source. The SOA is used to amplify the light output by the DFB or DBR laser prior to being modulated by the EAM.

SOAs are non-lasing optical amplifiers that contain a semiconductor active region. An electrical current is typically used to pump the electronic population in the active region. As an optical signal propagates through the active region it experiences gain due to the stimulated emission. One problem with non-lasing semiconductor optical amplifiers is that the gain depends on the amplitude of the optical signal. This problem is the result of gain saturation, in which there are insufficient carriers in the conduction band to provide the full amount of gain to higher power signals. As a result, a strong optical signal will be amplified less than a weak signal and strong portions of the optical signal will be amplified less than weak portions. This non-linear gain results in distortion of the optical signal and crosstalk between different optical signals propagating simultaneously through the system, significantly limiting the attractiveness of SOAs. The non-linear gain also introduces chirp.

EMLs are currently widely used in medium to long haul fiber-optic systems. Typically, EMLs are used in optical systems operating at bit rates around 1 billion bits per second (Gbps) over about 320 kilometers (km), bit rates around 2.5 Gbps over about 160 to 640 km, or bit rates around 10 Gbps over distances less than 80 km. Below this performance envelope, a laser source that is directly modulated can be used in place of an EML because such applications are not as susceptible to dispersion and chirp. Above this envelope however, an external lithium niobate ($LiNO_3$ modulator) typically is used to reduce dispersion and chirp, which is a limiting factor in optical systems operating above these ranges.

EML sources currently have two major limitations which limit their performance. First, the maximum output power of the EML is limited to approximately 1 mW. The DFB and DBR lasers have limited output power. This power can be boosted to approximately 10 mW by integrating an SOA between the laser source and the EAM. However, the EAM has approximately 10 dB of loss associated with it. Therefore, the output power of the EML+SOA+EAM combination is limited to approximately 1 mW. This output cannot be amplified further by a second SOA integrated after the EAM because the second SOA would introduce TDM crosstalk (intersymbol interference) in the modulated optical signal. Thus, EMLs are currently limited to a maximum output power of approximately 1 mW.

The second limitation of the EML is that it is limited to a single laser source integrated on a chip. To produce a wavelength division multiplexed (WDM) optical signal using EML sources, a separate EML would be used to generate each wavelength channel. Then, the individual channels would be combined using a waveguide coupler or wavelength division multiplexer into a single WDM optical signal. However, waveguide couplers and wavelength division multiplexers have high losses associated with them. Since the output power of the EMLs is already limited, the loss introduced by these devices makes this combination impractical. In addition, an SOA cannot be integrated after the waveguide coupler or wavelength division multiplexer due to the TDM and WDM crosstalk that the SOA would introduce into the optical signal.

What is needed is a small and inexpensive optical transmitter that can produce high speed, high power optical signals that can be used in single wavelength, time division multiplexed and wavelength division multiplexed optical signals.

SUMMARY OF THE INVENTION

An improved optical transmitter includes a vertically lasing semiconductor optical amplifier (VLSOA) coupled, either directly or indirectly (including intervening elements such as detectors), to a laser source and/or a modulator. The VLSOA includes a semiconductor active region and a vertical laser cavity. An amplifying path traverses the semiconductor active region and the vertical laser cavity includes the semiconductor active region. Optical signals are amplified as they propagate along the amplifying path. The laser cavity is pumped above a lasing threshold, thereby clamping the gain along the amplifying path to a substantially constant value. The linear gain characteristics of the VLSOA result in an optical transmitter that produces a high power optical signal with substantially less distortion, crosstalk and chirp. Another advantage is the ability to integrate the VLSOA with the modulator and/or laser source.

In one implementation, the VLSOA is coupled directly to the laser source and/or modulator. In another implementation, the couplings are achieved by optical fibers, optical waveguides, free space optics or other passive elements. In yet another implementation, there are more complex elements (e.g., filters, additional amplifiers, isolators) located between the VLSOA and the laser source and/or modulator. The laser source and modulator themselves can also be complex or include multiple elements.

In one embodiment, an optical transmitter includes multiple laser sources and external modulators, which are coupled by an optical coupler (e.g., a waveguide coupler or a wavelength division multiplexer) to a VLSOA. In this embodiment, each laser source produces an optical carrier at a different wavelength which is modulated by a corresponding modulator. The optical coupler combines the plurality of different wavelength optical signals into a single wavelength division multiplexed optical signal, which is amplified by the VLSOA. In one variation, additional amplifiers (VLSOA or other) are located in each arm to amplify each individual channel before combining by the optical coupler.

In another aspect of the invention, the laser source, external modulator and VLSOA are integrated onto a common substrate. In one implementation, the active region of the laser source transitions into the active region of the external modulator which transitions into the active region of the VLSOA. The active regions of the laser source, modulator and VLSOA may be fabricated based on a common structure which is altered so that the active regions have different transition energies.

In another embodiment of the invention, an external modulator and a VLSOA are integrated on a common substrate to create an improved external modulator. External modulators can have a high loss associated with them. By integrating a VLSOA with the external modulator, the VLSOA can amplify the modulated optical signal to make up for the loss introduced by the external modulator. This combination essentially results in a lossless, integrated external modulator.

The present invention is advantageous because the linear gain characteristics of the VLSOA significantly reduce WDM and TDM crosstalk when amplifying optical signals. As a result, VLSOAs can be used to amplify optical signals which have been modulated at high data rates and/or which contain multiple channels located at different wavelengths. The resulting optical transmitter can provide a high power optical signal with low distortion and crosstalk. The present invention is also advantageous because the integration of a laser source, external modulator and VLSOA on a common substrate supports the building of integrated optical circuits. This, in turn, will accelerate the adoption and development of optical technologies.

DETAILED DESCRIPTION OF THE PREFERRED EMBODIMENTS

Figure 1:
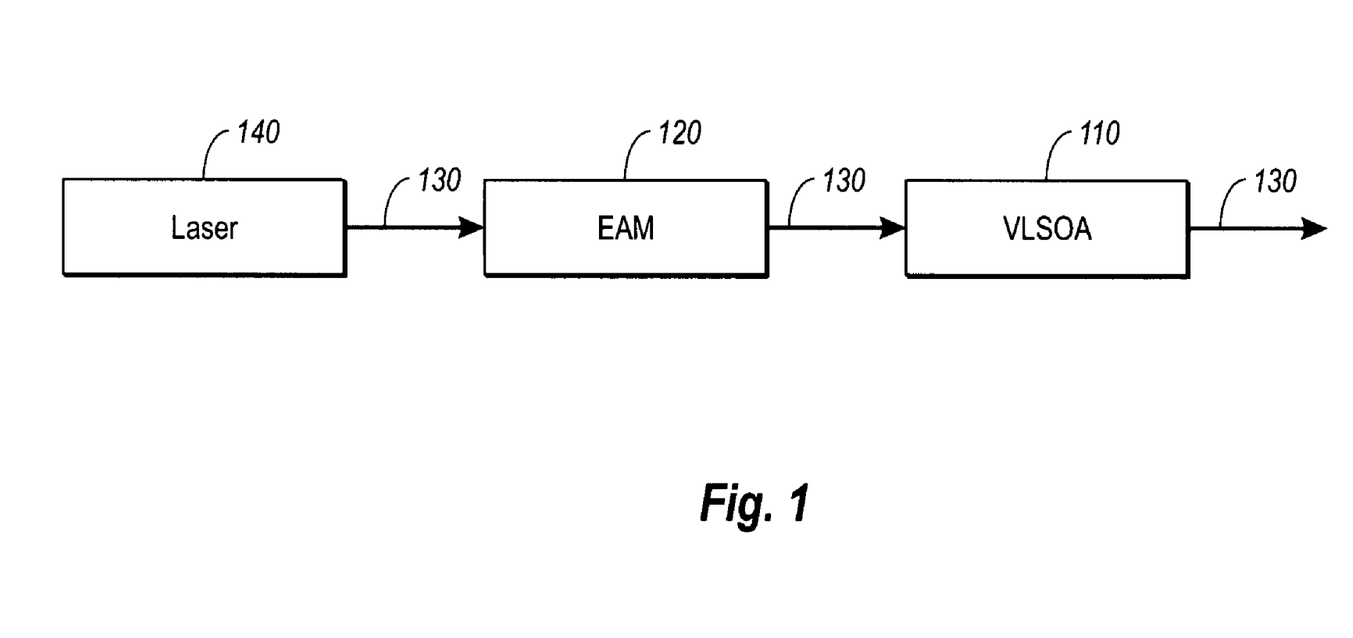
FIG. 1 is a block diagram of an optical transmitter according to the invention.
Figure 2:
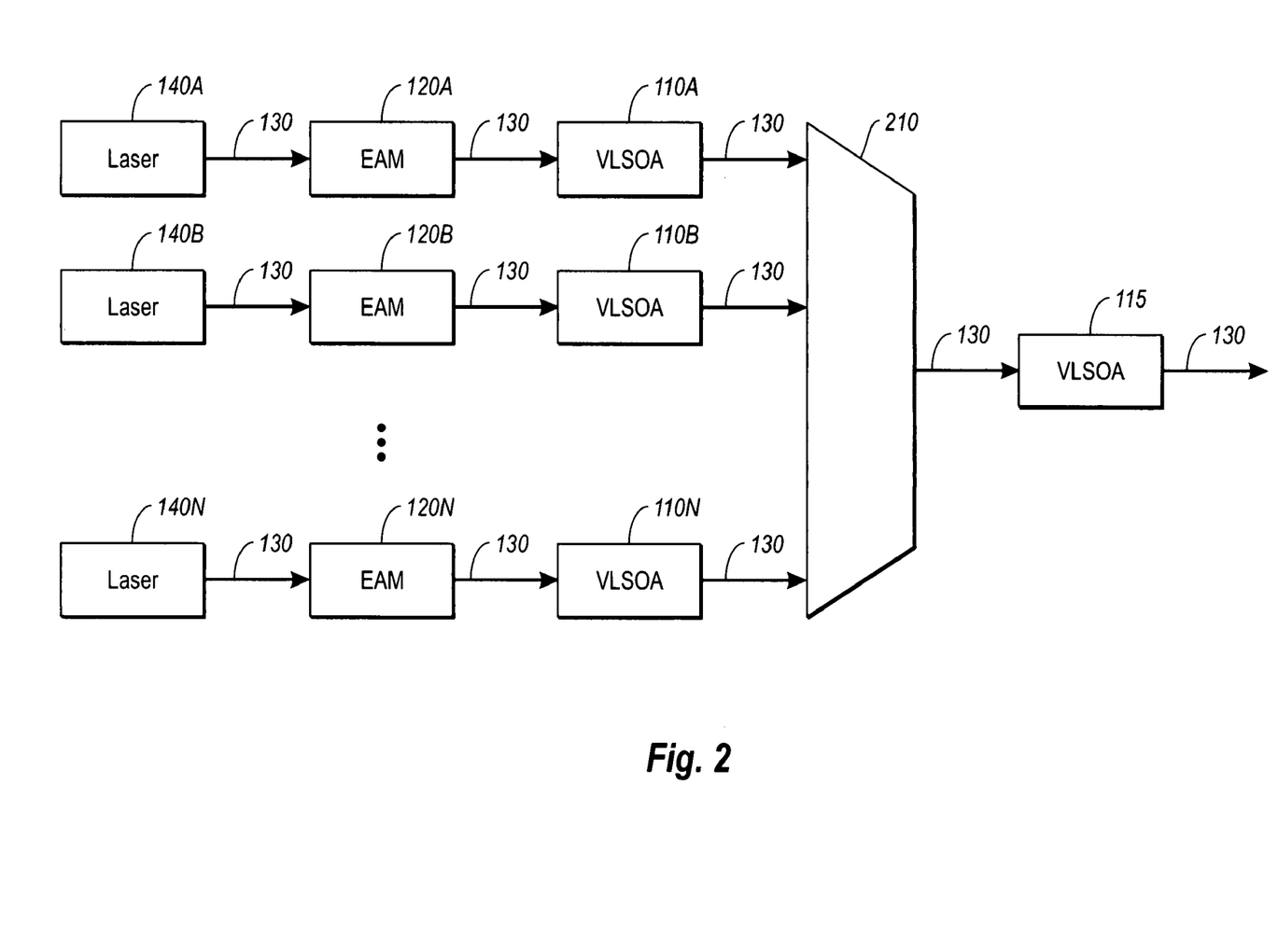
FIG. 2 is a block diagram of an integrated WDM transmitter according to the invention.

FIGS. 1 and 2 are block diagrams of example optical transmitters according to the present invention. Each of FIGS. 1 and 2 depicts a VLSOA in combination with some other optical element. In some embodiments, these combinations are implemented as combinations of discrete devices, which may be also packaged separately or which may be combined into a single package. For example, in one embodiment of FIG. 1, each of the VLSOA 110, electro-absorption modulator (EAM) 120 and laser source 140 is a separate discrete device, and they are coupled together by optical fibers 130. In a preferred embodiment, the combinations shown in FIGS. 1 and 2 are implemented as integrated optics, in which multiple optical elements are integrated onto a common substrate. Applying this approach to FIG. 1, VLSOA 110, EAM 120 and laser source 140 are integrated onto a common substrate to make a single chip transmitter. The integrated and discrete approaches may be combined to form hybrid versions. For example, in FIG. 1, the laser source 140 and EAM 120 may be integrated as an EML, with the VLSOA 110 coupled to the EML via fiber 130.

FIG. 1 is a block diagram of VLSOA 110 in combination with a laser source 140 and an EAM 120. In one embodiment, laser source 140 is coupled to EAM 120 and EAM 120 is further coupled to VLSOA 110. The devices can be coupled using optical fibers 130 as illustrated in FIG. 1, by other types of guided wave structures, by free space optics (e.g., a lens) or other optics, or can be integrated with each other.

Laser source 140 generates an optical carrier, which is passed to EAM 120. EAM 120 modulates the optical carrier, for example through on-off keying, to impress the data on the optical signal. The modulated optical signal is received by VLSOA 110, where it is amplified. Examples of laser sources that can be used in the present invention include DBR lasers including sampled grating DBR lasers, DFB lasers, tunable or wavelength selectable lasers, vertical cavity lasers, laser arrays (including those which are waveguide coupled) and Fabry Perot lasers. The laser source 410 can be complex or include multiple elements. For example, laser source 410 may have many sections, thus allowing control (and possibly also monitoring) of wavelength and output power. In one embodiment, the laser source 410 includes the following sections: a grating, a gain section, a tuning section to select the wavelength of the laser source 410, a second grating (the two gratings define the laser cavity), a conventional SOA to amplify the laser output and detectors located before and after the SOA in order to monitor the laser output. The invention is not limited to the laser sources listed above.

In addition, the invention is not limited to electroabsorption modulators. Examples of other modulators include lithium niobate modulators and other types of Mach Zender, interferometric or absorptive modulators. The modulators may also be complex. In another embodiment, the laser source is directly modulated so that a separate external modulator is not required. The term "modulated source" will be used to refer to devices that can produce a modulated optical signal. This includes both internally modulated laser sources as well as unmodulated laser sources in combination with external modulators.

In a preferred embodiment, laser source 140, EAM 120 and VLSOA 110 are implemented as a single integrated device. This results in a smaller, more reliable device. In one embodiment, the components 140, 120 and 110 are directly coupled to each other (e.g., the waveguided region of one component couples directly to the waveguided region of the next component). In an alternate embodiment, waveguides are used to couple the components to each other. Integrating the components together is further discussed herein.

FIG. 2 is a block diagram of an optical transmitter that produces a wavelength division multiplexed optical signal. In this example, the multi-wavelength signal is generated by a combination of a plurality of laser sources 140A–N, a plurality of EAMs 120A–N, a plurality of VLSOAs 11A–N and an optical coupler 210. In this embodiment, each laser source 140 is coupled to a respective EAM 120, which in turn is coupled to a respective VLSOA 110. The VLSOAs 110A–N are coupled to the optical coupler 210, which in this example is a waveguide coupler. The output of waveguide coupler 210 is coupled to VLSOA 115. As with FIG. 1, the combination shown in FIG. 2 may be implemented as discrete devices coupled together by optical fibers, as an integrated device, or as a partly discrete and partly integrated device. For example, in one hybrid embodiment, the waveguide coupler 210 is integrated with VLSOA 115 as a discrete package; each set of laser source 140, EAM 120 and VLSOA 110 is integrated as a separate package; and the various packages are coupled together by optical fibers or free space optics.

The device illustrated in FIG. 2 operates in the following way. Each laser source 140A–N produces an optical signal which is passed to its respective EAM 120A–N. Each laser source is configured such that each optical signal output by laser sources 140A–N has a different wavelength. Each EAM 120A–N modulates the optical signal output by the corresponding laser source 140A–N, for example using on-off keying, to impress data onto the optical carrier. Each modulated optical signal is passed to its respective VLSOA 110, where it is amplified. Waveguide coupler 210 receives the plurality of optical signals from VLSOAs 110A–N and combines the plurality of different wavelength optical signals into a single WDM optical signal which is output to VLSOA 115. VLSOA 115 amplifies the WDM optical signal. In an alternative embodiment, a wavelength division multiplexer or other type of combiner could be used in the location of waveguide coupler 210. In one embodiment, the gain of each VLSOA 110 may be set independently so that, for example, the power of the optical signals can be balanced prior to being combined in waveguide coupler 210. As the WDM optical signal propagates through the active region of VLSOA 115, all of the WDM channels in the multi-wavelength optical signals are amplified.

Conventional SOAs generally are not well suited to amplifying multi-wavelength data communication signals because the crosstalk between the different wavelength signals unacceptably degrades the optical signals. In addition, conventional SOAs do not amplify high speed Gbps single wavelength optical signals well either, due to intersymbol interference. As a result, conventional SOAs generally are not suitable replacements for the VLSOAs 110 and 115 in FIG. 2. By contrast, VLSOAs do not have the crosstalk problems that are inherent in non-lasing SOAs. The gain in a VLSOA is clamped to a constant value by the lasing cavity, therefore, the entire optical signal experiences the same gain as it propagates through the active region of the VLSOA. Because of the linear gain characteristics of the VLSOA, crosstalk and distortion in the optical signal are significantly reduced when an optical signal is amplified by the VLSOA as opposed to a non-lasing SOA. For this reason, the VLSOA can simultaneously amplify multiple wavelengths of a WDM optical signal in a single amplifier. In addition, the lifetime of carriers in the VLSOA active region is shorter than those in SOAs due to stimulated emission. Thus, VLSOAs are faster and can amplify TDM optical signals at bit rates up to and beyond 40 Gbps without significant intersymbol interference (TDM crosstalk).

Figure 3A:
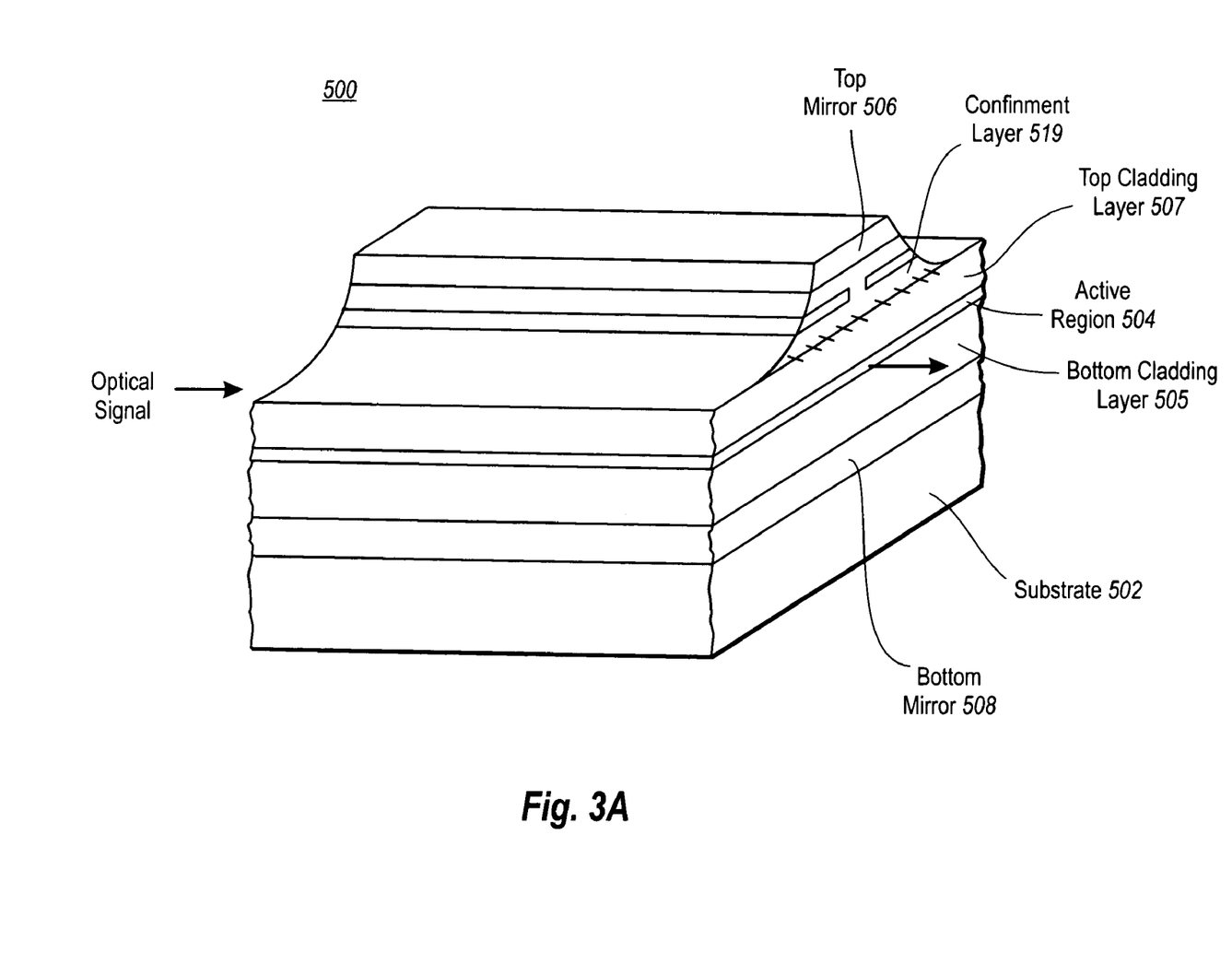
FIGS. 3A–C are a perspective view, transverse cross-sectional view, and a longitudinal cross-sectional view of one embodiment of a vertically lasing semiconductor optical amplifier (VLSOA) 500.
Figure 3B:
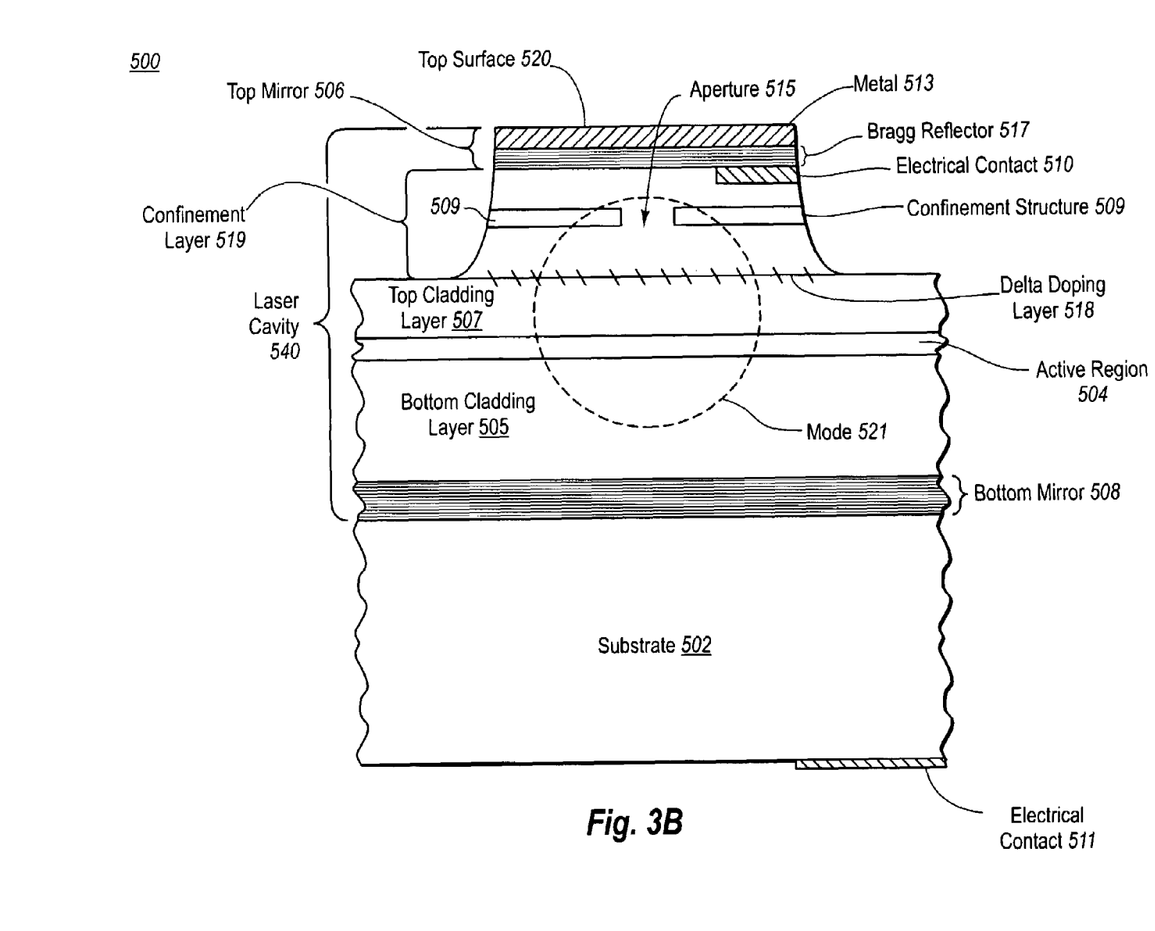
Figure 3C:
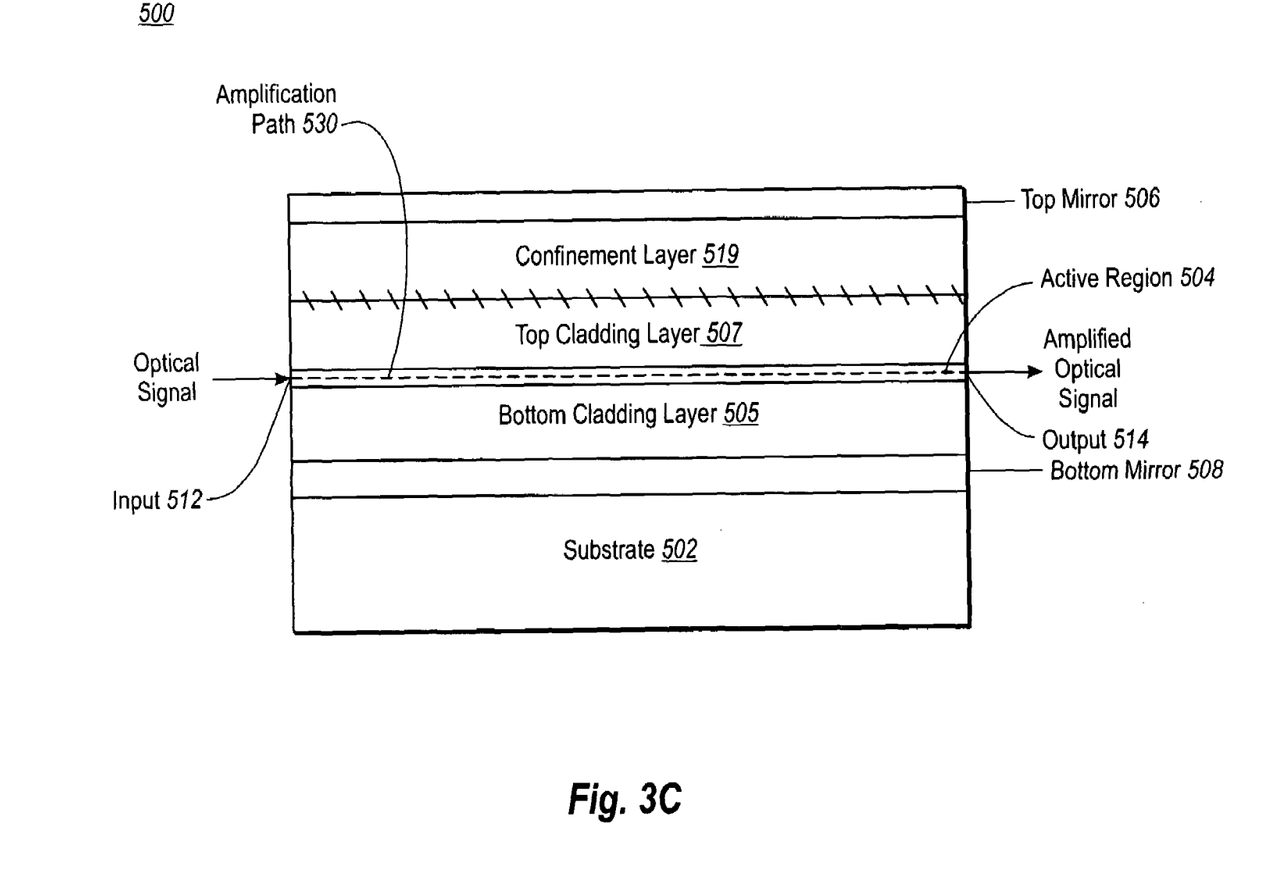

FIGS. 3A–3C are a perspective view, transverse cross-section, and longitudinal cross-section, respectively, of one embodiment of VLSOA 500 according to the present invention, with FIG. 3B showing the most detail.

Referring to FIG. 3B and working from bottom to top in the vertical direction (i.e., working away from the substrate 502), VLSOA 500 includes a bottom mirror 508, bottom cladding layer 505, active region 504, top cladding layer 507, confinement layer 519, and a top mirror 506. The bottom cladding layer 505, active region 504, top cladding layer 507, and confinement layer 519 are in electrical contact with each other and may be in direct physical contact as well. An optional delta doping layer 518 is located between the top cladding layer 507 and confinement layer 519. The confinement layer 519 includes a confinement structure 509, which forms aperture 515. The VLSOA 500 also includes an electrical contact 510 located above the confinement structure 509, and a second electrical contact 511 formed on the bottom side of substrate 502.

VLSOA 500 is a vertical lasing semiconductor optical amplifier since the laser cavity 540 is a vertical laser cavity. That is, it is oriented vertically with respect to the amplifying path 530 and substrate 502. The VLSOA 500 preferably is long in the longitudinal direction, allowing for a long amplifying path 530 and, therefore, more amplification. The entire VLSOA 500 is an integral structure formed on a single substrate 502 and may be integrated with other optical elements. In most cases, optical elements which are coupled directly to VLSOA 500 will be coupled to the amplifying path 530 within the VLSOA. Depending on the manner of integration, the optical input 512 and output 514 may not exist as a distinct structure or facet but may simply be the boundary between the VLSOA 500 and other optical elements. Furthermore, although this disclosure discusses the VLSOA 500 primarily as a single device, the teachings herein apply equally to arrays of devices.

VLSOA 500 is a layered structure, allowing the VLSOA 500 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 500 is confined in the vertical direction by index differences between bottom cladding 505, active region 504, and top cladding 507, and to a lesser extent by index differences between the substrate 502, bottom mirror 508, confinement layer 519, and top mirror 506. Specifically, active region 504 has the higher index and therefore acts as a waveguide core with respect to cladding layers 505,507. The optical signal is confined in the transverse direction by index differences between the confinement structure 509 and the resulting aperture 515. Specifically, aperture 515 has a higher index of refraction than confinement structure 509. As a result, the mode of the optical signal to be amplified is generally concentrated in dashed region 521. The amplifying path 530 is through the active region 504 in the direction in/out of the plane of the paper with respect to FIG. 3B.

The choice of materials system will depend in part on the wavelength of the optical signal to be amplified, which in turn will depend on the application. Wavelengths in the approximately 1.3–1.7 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In one embodiment, the VLSOA 500 is optimized for the 1.55 micron window.

In one embodiment, the active region 504 includes a multiple quantum well (MQW) active region. MQW structures include several quantum wells and quantum wells have the advantage of enabling the formation of lasers with relatively low threshold currents. In alternate embodiments, the active region 504 may instead be based on a single quantum well or a double-heterostructure active region. The active region 504 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 505 and 507 will depend in part on the composition of active region 504.

Examples of top and bottom mirrors 506 and 508 include Bragg reflectors and non-Bragg reflectors such as metallic mirrors. Bottom mirror 508 in FIG. 3 is shown as a Bragg reflector. Top mirror 506 is depicted as a hybrid mirror, consisting of a Bragg reflector 517 followed by a metallic mirror 513. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 510, 511 are metals that form an ohmic contact with the semiconductor material. Commonly used metals include titanium, platinum, nickel, germanium, gold, palladium, and aluminum.

In this embodiment, the laser cavity is electrically pumped by injecting a pump current via the electrical contacts 510, 511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 3, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier. This is advantageous because VLSOA 500 is long in the longitudinal direction and independent pumping allows, for example, different voltages to be maintained at different points along the VLSOA. Alternately, the contacts 510 may be doped to have a finite resistance or may be separated by finite resistances, rather than electrically isolated.

Confinement structure 509 is formed by wet oxidizing the confinement layer 519. The confinement structure 509 has a lower index of refraction than aperture 515. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current. Other confinement techniques may also be used, including those based on ion implantation, impurity induced disordering, ridge waveguides, buried tunnel junctions, and buried heterostructures.

Figure 4:
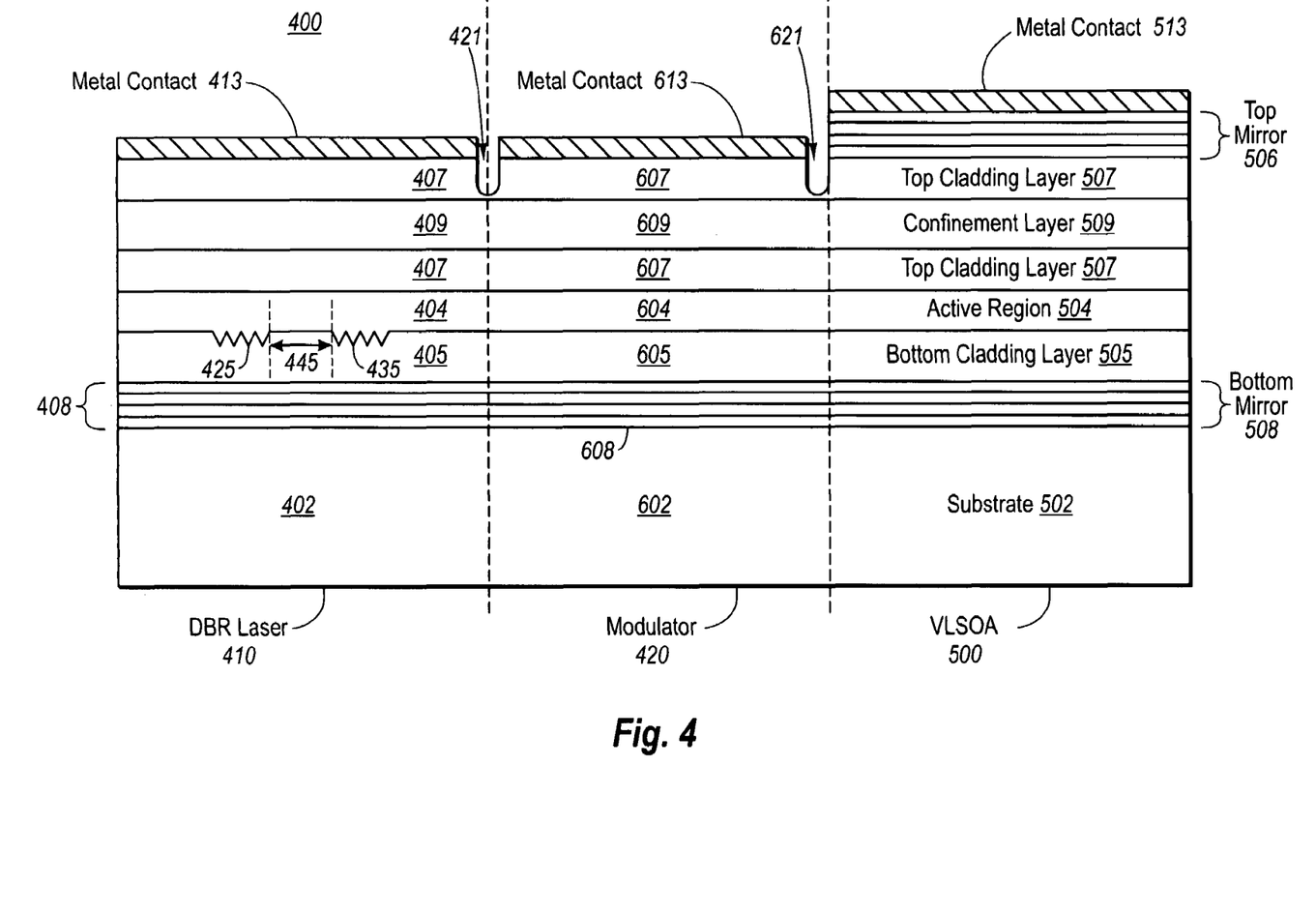
FIG. 4 is a longitudinal cross-sectional view of an example integrated optical transmitter 400 which includes a VLSOA 500 coupled directly to a modulator 420 which is directly coupled to a laser source 410.
Figure 5:
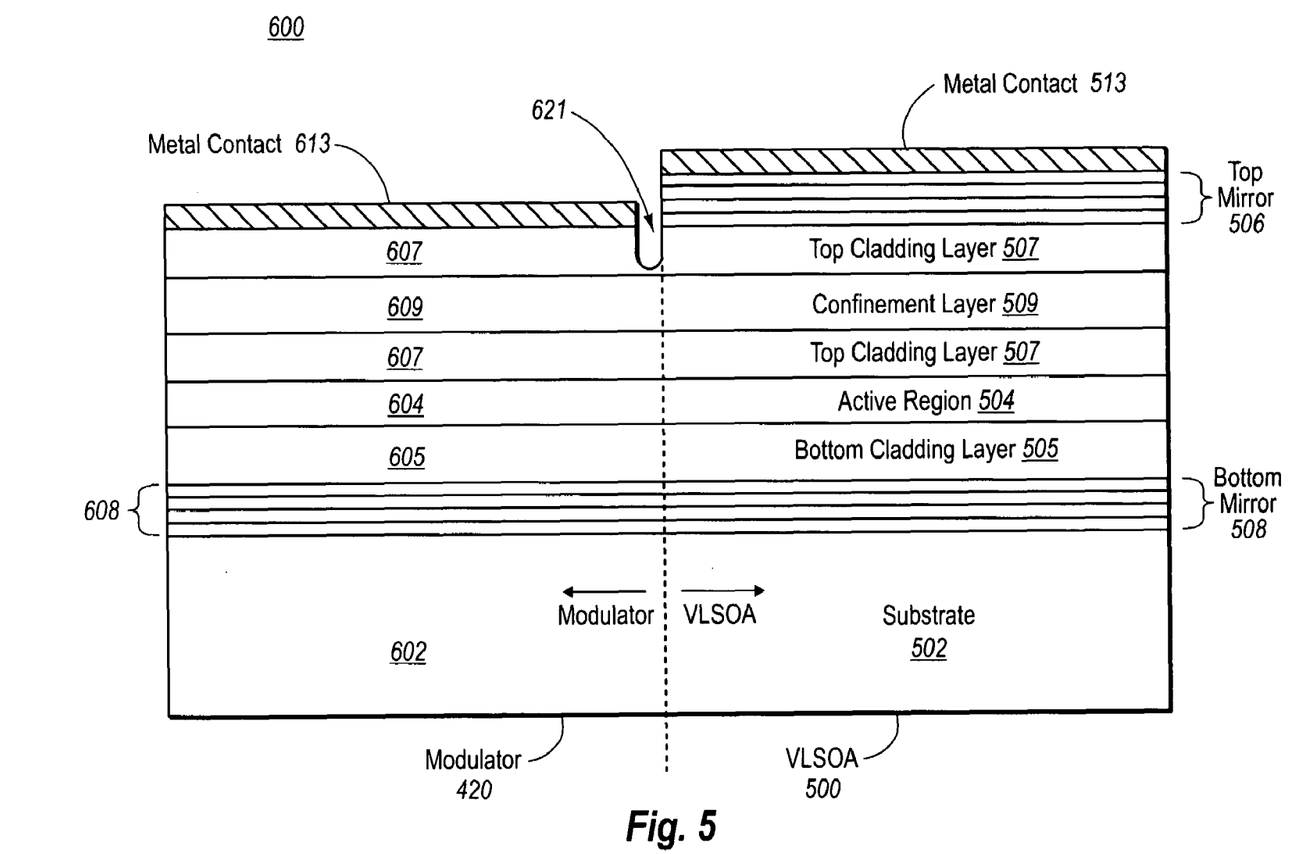
FIG. 5 is a longitudinal cross-sectional view of an example integrated external modulator 600 which includes a VLSOA 500 coupled directly to a modulator 420.
Figure 6:
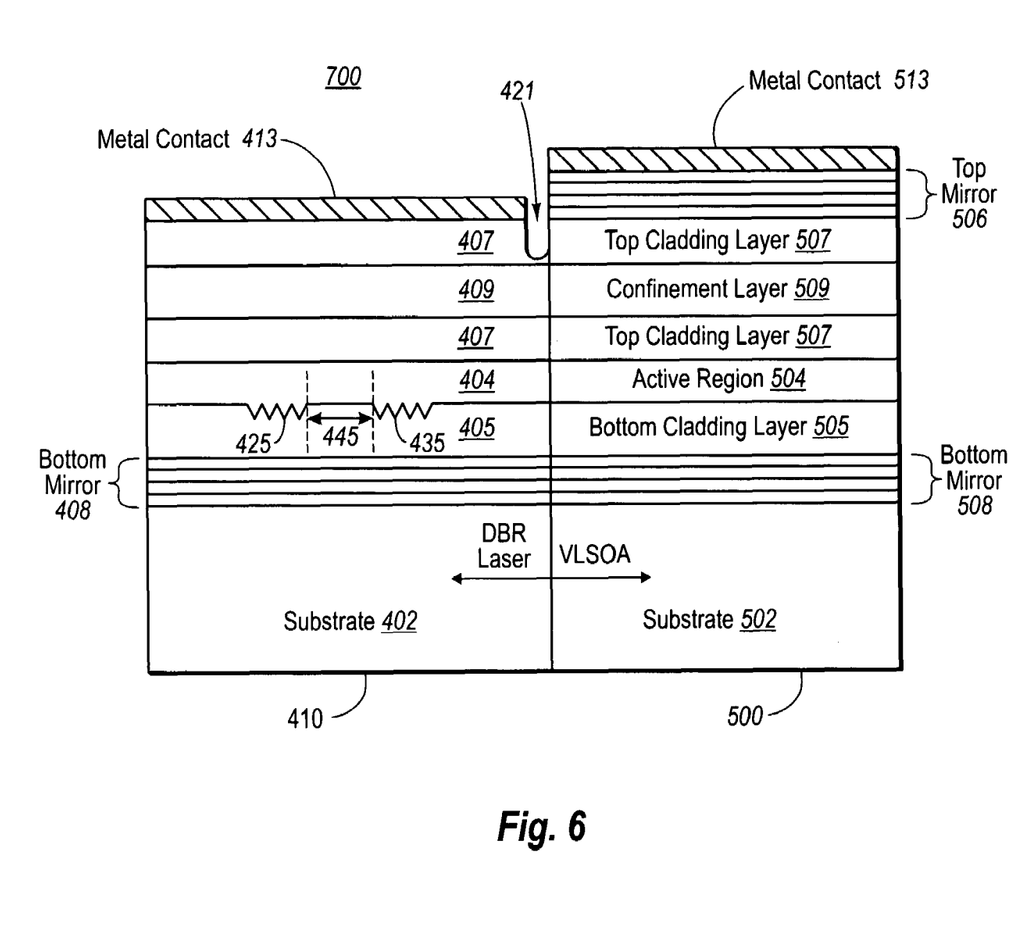
FIG. 6 is a longitudinal cross-sectional view of an example integrated optical transmitter 700 which includes a VLSOA 500 coupled directly to a laser source 410.

FIGS. 4–6 are block diagrams of example integrated optical transmitters (or portions of optical transmitters). The devices shown are simplified for clarity. The invention is not limited to these specific structures.

FIG. 4 is a simplified longitudinal cross sectional view of an integrated optical transmitter 400 which includes a VLSOA 500 coupled to EAM 420 and a DBR laser source 410. Many designs for VLSOA 500, EAM 420 and DBR laser 410 are appropriate, but in the following description, VLSOA 500 is assumed to follow the design of FIG. 3B and EAM 420 and DBR laser 410 are assumed to be similarly constructed.

As illustrated in FIG. 4, the layers of VLSOA 500 continue into EAM 420 and DBR laser 410. In particular, substrate 402 transitions into substrate 602 which transitions into substrate 502, bottom mirror 408 transitions into bottom mirror 608 which transitions into bottom mirror 508, bottom cladding layer 405 transitions into bottom cladding layer 605 which transitions into bottom cladding layer 505, active region 404 transitions into active region 604 which transitions into active region 504, top cladding layer 407 transitions into top cladding layer 607 which transitions into top cladding layer 507, and confinement structure 409 transitions into confinement structure 609 which transitions into confinement structure 509. In addition, VLSOA 500 has a top mirror 506 and a metal contact 513 above top cladding layer 507. By contrast, EAM 420 and DBR laser 410 have metal contacts 613 and 413 above top cladding layers 607 and 407, respectively. Electrical isolation (in this example, isolation etches 421 and 621 which extend partway into the top cladding layer 407-607-507) is used to provide electrical isolation (or at least an increased resistance) between DBR laser 410, EAM 420 and VLSOA 500.

Some of these layers transition from one element to the next because they perform analogous functions from element to element. The bottom cladding layers 405-605-505, active regions 404-604-504, and top cladding layers 407-607-507 are examples of this. Other layers are present in multiple elements because it is convenient from a fabrication standpoint. For example, bottom mirrors 408 and 608 are not required for DBR laser 410 or EAM 420 but are present because it is simpler to fabricate them than to not fabricate them.

In one embodiment, substrates 502, 602 and 402, bottom cladding layers 505, 605 and 405, top cladding layers 507, 607 and 407, and confinement structures 509, 609 and 409 are identical. However, the active regions, 504, 604 and 404 are different as will typically be the case. Active region 404 of laser 410 is designed to produce an optical carrier. Active region 604 of EAM 420 is designed to absorb the optical carrier as it propagates through the EAM 420, the amount of absorption depending on the voltage applied to the EAM 420. By varying the applied voltage, the amount of absorption can also be varied, thus resulting in modulation of the optical carrier. Active region 504 is designed to support the amplification function of VLSOA 500. Active regions 504, 604 and 404 are aligned in order to reduce the optical reflection at the interfaces of the optical elements and also to increase the coupling efficiency between the optical elements.

In one embodiment, the active regions 404, 604 and 504 are fabricated by starting with a common structure for the three elements and then changing the "transition energy" for the different elements to achieve the desired properties. The term "transition energy" is used to mean the change in energy for the energy transitions which are relevant to a particular device. In many devices, the transition energy is determined by the bandgap energy of the bulk materials of the device. However, the transition energy can also be affected by other parameters as well. For example, in quantum wells, the quantum confinement energy also affects the transition energy. As a result, changing the width of quantum wells without changing the bulk material composition can result in changes in the transition energy. Quantum wells also have the property that their transition energy can be reduced by applying a voltage. Semiconductor structures are transparent, meaning that they have much lower absorptions, for light with photon energies which are less than the transition energy for the structure. Transparent structures are important in devices such as waveguides, which simply pass an optical signal without absorbing any of the optical signal.

In one embodiment of EAM 420, active region 604 is a multiple quantum well active region designed so that the transition energy is less than the photon energies of the optical signal when a certain voltage is applied, is more than the photon energies of the optical signal when no voltage is applied, and varies in between for intermediate voltages. This is accomplished by altering the material composition and quantum well thickness of active region 604. When voltage is applied, the transition energy of active region 604 is less than the photon energies of the optical signal and active region 604 will absorb the optical signal as it propagates through active region 604. When no voltage is applied, the transition energy of active region 604 is more than the photon energies of the optical signal and active region 604 will pass the optical signal without affecting the optical signal. In this way, on-off keying can be implemented. By varying the voltage applied to EAM 420, data is impressed onto the optical signal.

By contrast, the active region 504 of VLSOA 500 is designed so that the transition energy is similar to the transition energy of active region 404 of laser 410. This results in amplification of the optical signal as it propagates through the active region 504 of VLSOA 500.

As illustrated in FIG. 4, gratings 425 and 435 are etched below the active region 404. These gratings define the laser cavity and set the optical carrier wavelength for DBR laser 410. In a DFB laser, gratings 425 and 435 would be adjacent to each other. In an alternate embodiment, the gratings 425 and 435 are located above the active region. In another embodiment, laser 410 has multiple gain and grating sections with separate electrical contacts designed to allow tuning of the optical carrier wavelength. In one approach, the gratings 425 and 435 are formed by removing the wafer from the MOCVD during growth of bottom cladding layers 405-605-505, wet etching the grating patterns 425 and 435, and then returning the wafer to the MOCVD to complete deposition of the remaining layers.

FIG. 5 illustrates another embodiment of the invention. This embodiment illustrates an improved external modulator including EAM 420 integrated with VLSOA 500. This embodiment is similar to the embodiment illustrated in FIG. 4, but without the DBR laser 410. As mentioned above, EAMs normally have a high loss associated with them. By integrating a VLSOA 500 with EAM 420, VLSOA 500 makes up for the loss introduced by the EAM 420 by amplifying the optical signal when it leaves EAM 420. This results in an integrated external modulator that introduces little or no loss in the optical signal as it is modulated. In an alternate embodiment, VLSOAs are integrated both before and after the EAM.

FIG. 6 illustrates another embodiment of the invention. The improved laser source 700 in this embodiment comprises DBR laser source 410 integrated with VLSOA 500.

This embodiment is also similar to FIG. 4, but without the EAM 420. This embodiment provides an optical source that produces a high power optical signal. In addition, active region 504 and active region 404 are aligned during the fabrication process to reduce the optical reflection at the interface of VLSOA 500 and DBR laser source 410.

In an alternate embodiment, the laser source 410 is replaced with a directly modulated laser source. This eliminates the need for an external modulator and results in a high power laser source that is directly modulated by varying the current applied to laser source 410.

The integration of VLSOAs with other optical elements may be implemented using any number of techniques, including those described above. For example, see also FIGS. 7–12 and the accompanying text of U.S. patent application Ser. No. 10/014679, "Integrated Optical Device Including a Vertical Lasing Semiconductor Optical Amplifier," by Jeffrey D. Walker et al., filed Dec. 11, 2001, which is incorporated herein by reference. In one approach, both the VLSOA and the other optical element are formed using a common fabrication process on a common substrate, but with at least one parameter varying between the VLSOA and the optical element. For example, selective area epitaxy (SAE) and impurity induced disordering (IID) are two fabrication processes which may be used in this manner.

In one approach based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the active region of another optical element, with the difference in transition energy accounting for the different optical properties of the VLSOA active region and the active region of the other optical element. SAE is particularly advantageous because it results in a smooth interface between optical elements and therefore reduces optical scattering at this interface. This in turn, reduces both parasitic lasing modes and gain ripple. Furthermore, the SAE approach can be confined to only the minimum number of layers necessary, thus minimizing the impact on the rest of the integrated optical device.

In one specific example based on SAE, the structure of FIG. 4 is fabricated as follows. First, the bottom mirror 408-608-508 and part of the bottom cladding 405-605-505 are grown by MOCVD on a common InP substrate 402-602-502. The gratings 425 and 435 are formed by removing the wafer from the MOCVD, and wet etching the grating patterns. A SiO2 SAE mask is patterned on the surface of the wafer adjacent to the laser 410 and VLSOA 500 active region areas 404 and 504 prior to continuing MOCVD growth of the active region 404-604-504 and top cladding layers 407-607-507. During deposition of the active region material, this SAE mask creates a lower transition energy active region for laser 410 and VLSOA 500, and a higher transition energy active region for modulator 420. The mask is removed and the remaining layers are fabricated.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the active region of another optical element, with the difference in transition energy again accounting for the different optical properties.

In the previous SAE and IID examples, the difference in transition energy results in different optical properties between the VLSOA active region and the active region of another optical element. Engineering the transition energy may also be used to fabricate many other types of integrated optical devices. For example, changing the transition energy between two VLSOAs can be used to optimize each VLSOA for a different wavelength region. In this way, the transition energy in a VLSOA could be graded in a controlled way to broaden, flatten, and shape the gain profile. Alternately, two different elements, such as a VLSOA and a laser source might require different transition energies for optimal performance. Other embodiments will be apparent to one skilled in the art.

In a different approach, the VLSOA and the optical element are formed on a common substrate but using different fabrication processes. In one example, a VLSOA is formed on the common substrate in part by depositing a first set of materials on the substrate. Next, the deposited material is removed from selected areas of the substrate, for example by an etching process. A second set of materials is deposited in the selected areas to form in part the optical element. Etch and fill is one process which follows this approach. As an example, suppose that a VLSOA and a modulator are being integrated onto a common substrate. Materials are deposited to form the VLSOA (or at least a portion of the VLSOA). In the areas where the modulator is to be located, these materials are removed and additional materials are deposited to form the modulator (or at least a portion of it).

In yet another approach, the VLSOA and the optical element are formed on separate substrates by separate fabrication processes and then integrated onto a common substrate. Planar lightwave circuitry and silicon optical bench are two examples of processes following this approach. In one example, the VLSOA is formed on a first substrate. The optical element is formed on a second substrate. The VLSOA and the optical element are then integrated onto a common substrate, which could be the first substrate, the second substrate or a completely different substrate.

FIGS. 1–6 are merely examples according to the present invention. Other types of optical transmitters or portions of optical transmitters which take advantage of some or all of the VLSOA's advantages, including small size, possibility of integration, linear amplification, and good crosstalk performance (both intersymbol and inter channel), will be apparent to one skilled in the art. For example, VLSOAs, modulators and optical sources with structures other than those shown above may be utilized. In addition, device architectures other than those shown in FIGS. 1–2 can also be realized. In addition, although the above discussion has centered on EAMs and DFB/DBR lasers, many other types of optical sources and modulators can be used. Also, additional optical elements, including optical filters, other types of optical amplifiers, optical detectors, optical taps, and optical splitters and combiners, can also be included.

As a final example, the VLSOAs may have adjustable gain, either open loop or based on feedback. Examples of VLSOAs with adjustable gain and corresponding control techniques are described further in the following pending patent applications, which are incorporated herein by reference in their entirety: U.S. patent application Ser. No. 09/273,813, "Tunable-Gain Lasing Semiconductor Optical Amplifier," filed Mar. 22, 1999, by Jeffrey D. Walker et al.; U.S. patent application Ser. No. 09/299,824, "Optical Signal Power Monitor and Regulator," filed Apr. 26, 1999, by Sol P. Dijaili and Jeffrey D. Walker; and U.S. patent application Ser. No. 09/967,859, "Multistage Tunable Gain Optical Amplifier," filed Sep. 28, 2001, by Sol P. Dijaili and John M. Wachsman.

What is claimed is:

1. An optical transmitter comprising:
a modulated source for generating a modulated optical signal; and
a vertical lasing semiconductor optical amplifier (VLSOA) coupled to the modulated source for amplifying the modulated optical signal, the VLSOA comprising:
a semiconductor active region;
an amplifying path traversing the semiconductor active region; and
a laser cavity including the semiconductor active region, wherein the laser cavity is oriented vertically with respect to the amplifying path and pumping the laser cavity above a lasing threshold clamps a gain along the amplifying path to a substantially constant value.

2. The optical transmitter of claim 1 wherein the modulated source and the VLSOA are implemented as discrete devices.

3. The optical transmitter of claim 2 further comprising:
an optical fiber coupling the modulated source to the VLSOA.

4. The optical transmitter of claim 2 further comprising:
free space optics coupling the modulated source to the VLSOA.

5. The optical transmitter of claim 1 wherein the modulated source comprises:
a laser source; and
a modulator coupled to the laser source.

6. The optical transmitter of claim 5 wherein the laser source and the modulator together include an electro-absorption modulated laser (EML).

7. The optical transmitter of claim 5 wherein:
the laser source and the modulator together include a wavelength-tunable laser integrated with an electro-absorption modulator; and
the VLSOA is implemented as a discrete device.

8. The optical transmitter of claim 5 wherein:
the laser source includes a wavelength-tunable laser;
the modulator includes an electro-absorption modulator; and
the wavelength-tunable laser, the electro-absorption modulator and the VLSOA are integrated on a common substrate.

9. The optical transmitter of claim 5 further comprising:
a semiconductor optical amplifier coupled between the laser source and the modulator.

10. The optical transmitter of claim 5 wherein the laser source is selected from a group consisting of a DBR laser and a DFB laser.

11. The optical transmitter of claim 5 wherein the modulator includes an electro-absorption modulator.

12. The optical transmitter of claim 5 wherein the modulator includes a lithium niobate modulator.

13. The optical transmitter of claim 5 wherein:
the laser source comprises an active region;
the modulator comprises an active region;
the laser source, the modulator and the VLSOA are integrated on a common substrate;
the active region of the laser source transitions into the active region of the modulator; and
the active region of the modulator transitions into the semiconductor active region of the VLSOA.

14. The optical transmitter of claim 5 wherein:
the laser source comprises an active region;
the modulator comprises an active region; and
the laser source, the modulator and the VLSOA are integrated on a common substrate; the semiconductor active region of the VLSOA and the active regions of the laser source and the modulator are based on a common structure which has been altered so that the semiconductor active region of the modulator has a different transition energy than the active region of the laser source and the active region of the VLSOA.

15. The optical transmitter of claim 5 wherein the laser source, the modulator and the VLSOA are integrated on an InP substrate.

16. The optical transmitter of claim 1 further comprising:
at least one additional modulated source, wherein each modulated source generates a modulated optical signal at a different wavelength; and an optical coupler coupling the modulated sources to the VLSOA.

17. The optical transmitter of claim 16 wherein each modulated source comprises: a laser source integrated with a modulator.

18. The optical transmitter of claim 16 wherein the modulated sources, the optical coupler and the VLSOA are integrated onto a common substrate.

19. The optical transmitter of claim 16 wherein the optical coupler comprises a wavelength division multiplexer.

20. The optical transmitter of claim 16 further comprising:
a plurality of optical amplifiers, at least one optical amplifier coupled between each modulated source and the optical coupler for amplifying the modulated optical signal generated by the modulated source.

21. The optical transmitter of claim 1 further comprising:
at least one additional modulated source; and
an optical coupler coupling the modulated sources to the VLSOA.

22. The optical transmitter of claim 1 wherein the modulated source comprises an internally modulated laser source.

23. The optical transmitter of claim 22 wherein the internally modulated laser source is integrated with the VLSOA on a common substrate.

24. The optical transmitter of claim 22 wherein the internally modulated laser source includes a vertical cavity laser.

25. The optical transmitter of claim 1 wherein the modulated optical signal lies in a wavelength region located between 1.3 micron and 1.7 micron.

26. The optical transmitter of claim 1 wherein the modulated optical signal includes at least two channels located at different wavelengths.

27. The optical transmitter of claim 1 wherein the modulated optical signal is modulated at a data rate of at least 1 Gbps.

28. The optical transmitter of claim 1 wherein the substantially constant value is adjustable.

29. An optical modulator comprising:
an external modulator; and
a vertical lasing semiconductor optical amplifier (VLSOA) coupled to the external modulator, the VLSOA comprising:
a semiconductor active region;

an amplifying path traversing the semiconductor active region; and a laser cavity including the semiconductor active region, wherein the laser cavity is oriented vertically with respect to the amplifying path and pumping the laser cavity above a lasing threshold clamps a gain along the amplifying path to a substantially constant value.

30. The optical modulator of claim 29 wherein the external modulator and the VLSOA are integrated onto a common substrate.

31. The optical modulator of claim 30 wherein the external modulator includes an electro-absorption modulator.

32. The optical modulator of claim 30 wherein:
the external modulator comprises an active region; and
the active region of the external modulator transitions into the semiconductor active region of the VLSOA.

33. The optical modulator of claim 30 wherein:
the external modulator comprises an active region; and
the semiconductor active region of the VLSOA and the active region of the external modulator are based on a common structure which has been altered so that the semiconductor active region of the VLSOA has a different transition energy than the active region of the external modulator.

34. An optical source comprising:
a laser source; and
a vertical lasing semiconductor optical amplifier (VLSOA) coupled to the laser source, the VLSOA comprising:
a semiconductor active region;
an amplifying path traversing the semiconductor active region; and
a laser cavity including the semiconductor active region, wherein the laser cavity is oriented vertically with respect to the amplifying path and pumping the laser cavity above a lasing threshold clamps a gain along the amplifying path to a substantially constant value.

35. The optical source of claim 34 wherein the laser source and the VLSOA are integrated onto a common substrate.

36. The optical source of claim 35 wherein the laser source is selected from a group consisting of a DBR laser and a DFB laser.

37. The optical source of claim 35 wherein:
the laser source comprises an active region; and
the active region of the laser source transitions into the active region of the VLSOA.

38. The optical source of claim 35 wherein:
the laser source comprises an active region; and
the semiconductor active region of the VLSOA and the active region of the laser source are based on a common structure.

39. The optical source of claim 35 wherein the common substrate is an InP substrate.

40. The optical source of claim 34 wherein the laser source includes a multi-wavelength source.

41. The optical source of claim 34 wherein the laser source includes a tunable-wavelength laser source.

42. A high power, high speed optical transmitter comprising:
a laser source for generating an optical carrier;
a modulator coupled to the laser source for modulating data onto the optical carrier at a data rate of at least 1 Gbps; and
a linear, semiconductor optical amplifier coupled to the modulator capable of amplifying the modulated optical carrier to a power of at least 1 mW.

43. The optical transmitter of claim 42 wherein the linear, semiconductor optical amplifier comprises a VLSOA.

44. The optical transmitter of claim 42 wherein the laser source and the modulator together include an electro-absorption modulated laser (EML).

45. The optical transmitter of claim 42 wherein the laser source, the modulator and the semiconductor optical amplifier are integrated on a common substrate.

* * * * *

UNITED STATES PATENT AND TRADEMARK OFFICE
CERTIFICATE OF CORRECTION

PATENT NO. : 7,065,300 B1
APPLICATION NO. : 10/017358
DATED : June 20, 2006
INVENTOR(S) : Walker It is certified that error appears in the above-identified patent and that said Letters Patent is hereby corrected as shown below:

Title Page
Column 1, Item 75, inventor, change "Jeffrey D Walker" to --Jeffrey D. Walker--

Column 5
Line 65, change "11A-N" to --110A-N--

Column 9
Line 41, after "420", insert --,--

Column 10
Lines 14-15, after "see", remove [also FIGS. 7-12 and]

Column 14
Line 53, change "1.3 micron and 1.7 micron" to --1.3 microns and 1.7 microns--

Column 16
Line 31, change "m W" to --mW--

Signed and Sealed this

Thirteenth Day of July, 2010

David J. Kappos
*Director of the United States Patent and Trademark Office*